United States Patent
Hermanson et al.

(10) Patent No.: US 9,484,183 B2
(45) Date of Patent: Nov. 1, 2016

(54) LINKAGE CONDUIT FOR VACUUM CHAMBER APPLICATIONS

(71) Applicant: Varian Semiconductor Equipment Associates, Inc., Gloucester, MA (US)

(72) Inventors: Eric D. Hermanson, Georgetown, MA (US); Robert J. Mitchell, Winchester, MA (US); Steven Anella, West Newbury, MA (US); Jeffrey Charles Blahnik, Leander, TX (US); William T. Weaver, Austin, TX (US); Michael Rohrer, Cedar Park, TX (US); James P. Buonodono, Amesbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/482,761

(22) Filed: Sep. 10, 2014

(65) Prior Publication Data

US 2016/0071686 A1    Mar. 10, 2016

(51) Int. Cl.
  *H01J 37/317*  (2006.01)
  *H01J 37/20*  (2006.01)
  *H01J 21/18*  (2006.01)

(52) U.S. Cl.
  CPC ............. *H01J 37/20* (2013.01); *H01J 21/18* (2013.01); *H01J 37/3171* (2013.01); *H01J 2237/202* (2013.01); *H01J 2237/2005* (2013.01)

(58) Field of Classification Search
  CPC ............... H01J 37/20; H01J 37/3171; H01J 2237/202; H01J 37/185
  See application file for complete search history.

(56) References Cited

U.S. PATENT DOCUMENTS

| | | | | |
|---|---|---|---|---|
| 5,527,217 A | * | 6/1996 | Engstrom | ................ 454/63 |
| 5,967,666 A | * | 10/1999 | Johnson | ................ 384/12 |
| 6,740,894 B1 | * | 5/2004 | Mitchell | ........ H01J 37/20 250/398 |
| 6,794,664 B1 | * | 9/2004 | Mitchell | ........ H01J 37/3171 250/491.1 |
| 2002/0000029 A1 | * | 1/2002 | Emoto | ........ B82Y 10/00 29/25.01 |
| 2005/0173655 A1 | * | 8/2005 | Naylor-Smith | ........ H01J 37/3171 250/492.21 |
| 2010/0084579 A1 | * | 4/2010 | Fish et al. | ................ 250/492.21 |
| 2014/0238300 A1 | * | 8/2014 | Hisada et al. | ................ 118/723 R |

* cited by examiner

*Primary Examiner* — Robert Kim
*Assistant Examiner* — Eliza Osenbaugh-Stewar

(57) ABSTRACT

An ion implantation apparatus including an enclosure defining a process chamber, a carriage slidably mounted on a shaft within the process chamber and coupled to a drive mechanism adapted to selectively move the carriage along the shaft. A platen assembly can be coupled to the carriage, and a linkage conduit can extend between a side wall of the enclosure and the carriage. The linkage conduit can include a plurality of pivotably interconnected linkage members that define a contiguous internal volume that is sealed from the process chamber. The contiguous volume can be held at a desired vacuum pressure separate from the vacuum environment of the process chamber.

18 Claims, 4 Drawing Sheets

LINKAGE CONDUIT FOR VACUUM CHAMBER APPLICATIONS

FIELD OF THE DISCLOSURE

Embodiments of the present disclosure relate to apparatus for use in semiconductor processing vacuum chambers, and more particularly to an ion implantation apparatus having a pivoting linkage conduit for coupling various facilities to a vacuum robot and other components of the ion implantation apparatus.

BACKGROUND OF THE DISCLOSURE

Ion implantation is a technique for introducing property-altering impurities into substrates. During a typical ion implantation process, a desired impurity material is ionized in an ion source, the ions are accelerated to form an ion beam of prescribed energy, and the ion beam is directed at the surface of a substrate. The energetic ions in the ion beam penetrate into the sub-surface of the substrate material and are embedded into the crystalline lattice of the substrate material to form a region of desired conductivity or material property.

An ion implanter may generate an ion beam having a roughly circular or elliptical cross sectional shape that is smaller than the surface of a substrate to be treated. A substrate, which may be a semiconductor, for example, may have a round, disk shape. In order to implant ions into substantially the entire surface of the substrate, the substrate may be mechanically driven or "scanned" in a direction that is orthogonal to the direction of an ion beam projected thereon. For example, if an ion beam is projected along a horizontal plane toward a vertically-oriented substrate, the substrate may be scanned in a vertical direction and/or in a lateral direction that is perpendicular to the projected ion beam. The entire surface of the substrate may thereby be exposed to the relatively smaller ion beam during an implantation process.

In order to mitigate particulate contamination of substrates during ion implantation processes, ion implantation apparatuses often include robots located within vacuum environments for supporting and scanning substrates. Such robots are generically referred to as "vacuum robots." A vacuum robot may include a controllably movable platen to which a substrate may be clamped. For example, the platen may be slidably mounted on a pair of vertically-oriented shafts and may be coupled to a linear drive mechanism that may be adapted to controllably drive the platen to various vertical positions along the shafts. The platen may be coupled to the shafts by differentially pumped air bearings that prevent or reduce physical contact between the shafts and the platen, thereby mitigating the production of particle contaminants that could otherwise be produced as a result of such contact.

Vacuum robots of the type described above can include numerous components that must be coupled to respective facilities by coupling members for supporting various functions, such as providing power and control signals to motors, providing pressurized gas and vacuum pumping for air bearings, providing cryogenic fluid for cooling the platen, etc. All such coupling members must be sealed from the process environment to prevent contamination of the substrates. Furthermore, cryogenic lines, if routed in a region of atmospheric gas, must be heavily insulated to prevent condensation and ice from forming on the outer surfaces thereof.

Coupling members can be routed through the interiors of vacuum robots to their respective components. Larger coupling members, such as heavily insulated cryogenic lines, are often routed through harnesses that are externally attached to the vacuum robot. Such routing schemes are associated with a number of shortcomings. For example, they consume a great deal of space within a process environment, they limit the mobility of vacuum robots, and they typically produce an appreciable amount of particle contamination. Thus, it would be advantageous to provide a solution for routing cryogenic lines and the like to vacuum robots and other components within vacuum environment in a manner that reduces the amount of space such lines occupy, that enables greater robot mobility, and that minimizes or eliminates the generation of particulate contamination within the vacuum environment.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

An exemplary embodiment of an ion implantation apparatus in accordance with the present disclosure includes an enclosure defining a process chamber, a carriage slidably mounted on a shaft within the process chamber and coupled to a drive mechanism adapted to selectively move the carriage along the shaft, a platen assembly coupled to the carriage, and a linkage conduit extending between a side wall of the enclosure and the carriage, the linkage conduit comprising a plurality of pivotably interconnected linkage members that define a contiguous internal volume that is sealed from the process chamber.

An exemplary embodiment of a linkage conduit for an ion implantation apparatus in accordance with the present disclosure includes a plurality of pivotably interconnected linkage members defining a contiguous internal volume that is coupled to a vacuum robot and a platen assembly.

Another exemplary embodiment of an ion implantation apparatus in accordance with the present disclosure includes an enclosure defining a process chamber, a carriage slidably mounted on a pair of shafts within the process chamber and coupled to a drive mechanism adapted to selectively move the carriage along the shafts, the carriage including air bearings surrounding the shafts that are adapted to mitigate transverse movement of the carriage relative to the shafts and to mitigate physical contact between the carriage and the shafts, a platen assembly coupled to the carriage, and a linkage conduit extending between a side wall of the enclosure and the carriage, the linkage conduit comprising a plurality of pivotably interconnected linkage members that are coupled to one another by fluid-tight rotary seals and that define a contiguous internal volume, wherein the linkage conduit is coupled to a vacuum source that maintains vacuum pressure within the internal volume.

BRIEF DESCRIPTION OF THE DRAWINGS

By way of example, various embodiments of the disclosed device will now be described, with reference to the accompanying drawings, in which.

DETAILED DESCRIPTION

Figure 1:
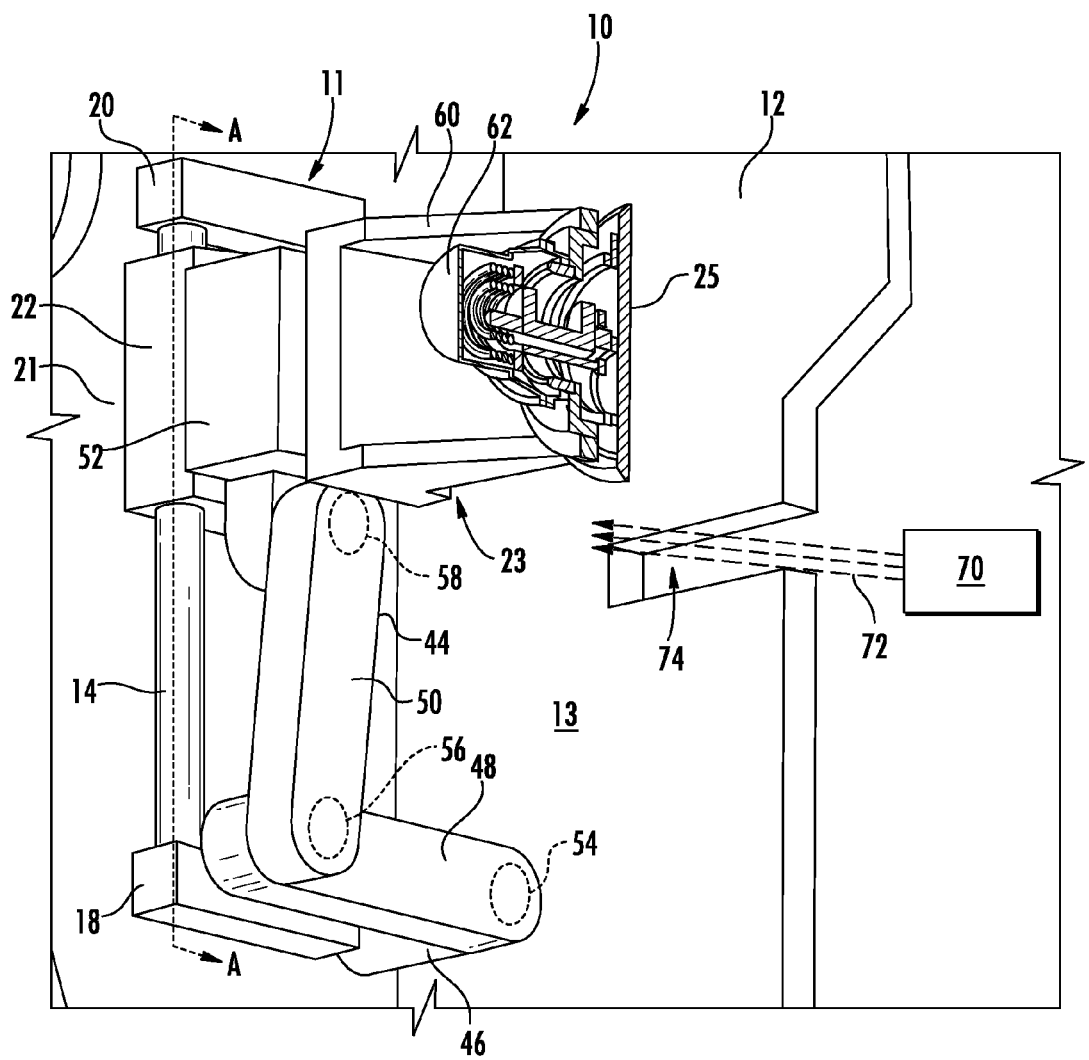
FIG. 1 is a cut-away perspective view illustrating an exemplary ion implantation apparatus in accordance with an embodiment of the present disclosure.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

Referring to FIG. 1, a cut-away view of an ion implantation apparatus 10 (hereinafter "the apparatus 10") consistent with a non-limiting, exemplary embodiment of the present disclosure is shown. For the sake of convenience and clarity, terms such as "front," "rear," "top," "bottom," "up," "down," "vertical," and "horizontal" will be used herein to describe the relative placement and orientation of the apparatus 10 and its various components, all with respect to the geometry and orientation of the apparatus 10 as it appears in FIG. 1.

Figure 2:
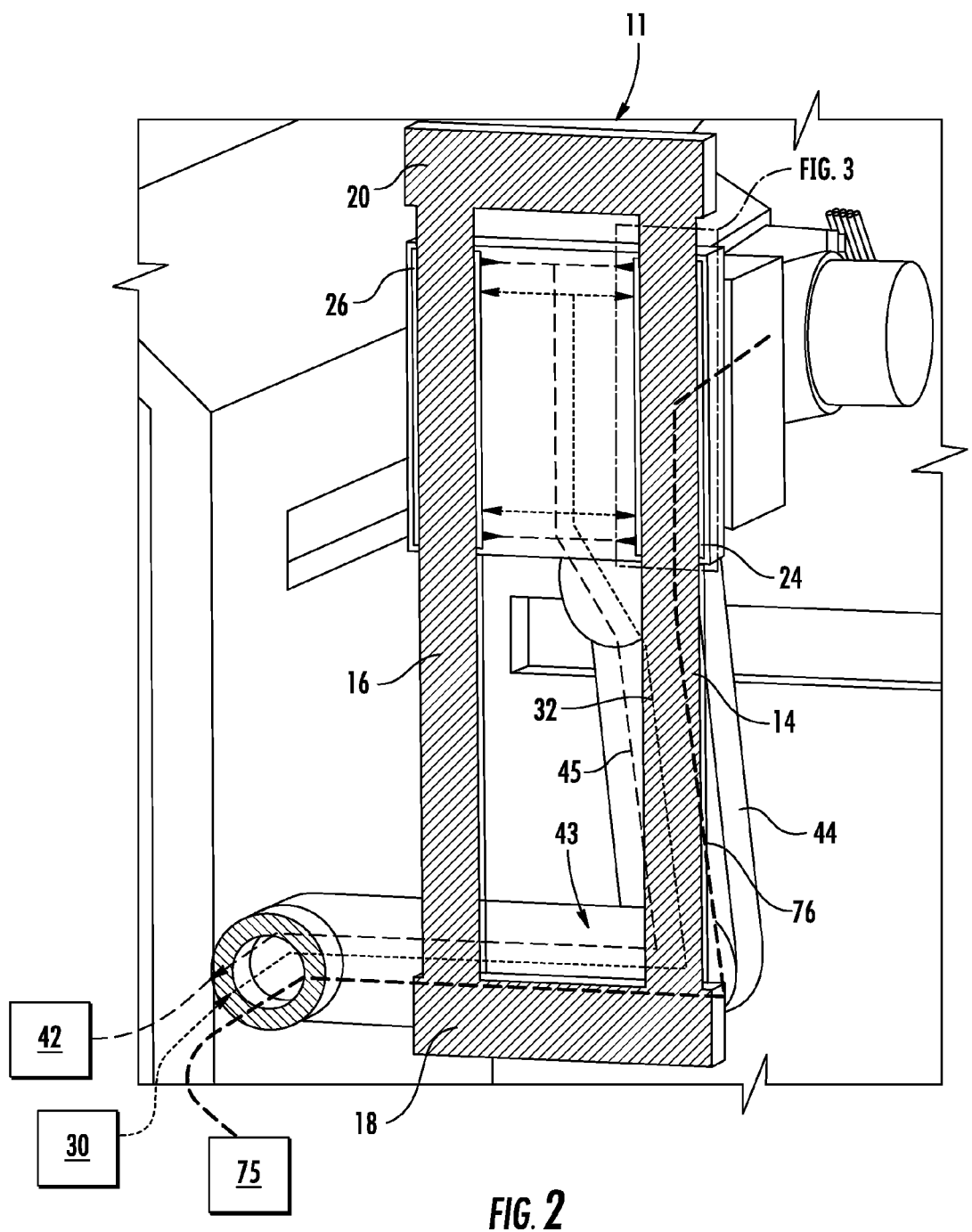
FIG. 2 is a rear cross-sectional view taken along the line A-A in FIG. 1 illustrating the vacuum robot of the ion implantation apparatus shown in FIG. 1.

The apparatus 10 may include an enclosure 12 that defines a process chamber 13. One or more pumps (not shown), such as turbomolecular pumps or cryogenic pumps, may be connected to the enclosure 12 for establishing and maintaining a vacuum environment within the process chamber 13. The apparatus 10 may further include a vacuum robot 11 that includes a vertically-movable carriage 22 mounted on a pair of vertically oriented, horizontally spaced shafts 14, 16 (shaft 16 is best shown in FIG. 2) that may be mounted at opposing longitudinal ends to a side wall 21 of the enclosure 12 by a pair of mounting brackets 18, 20. The carriage 22 may be adapted for selective vertical movement along the shafts 14, 16 for controllably raising and lowering a platen assembly 23. For example, a linear drive mechanism (not shown) may be operatively connected to the carriage 22 and may controllably drive or "scan" the carriage 22 vertically between a fully raised position (shown in FIG. 1) and a fully lowered position (not shown). The linear drive mechanism may be any type of linear actuator that is suitable for scanning the carriage 22 in a controllable manner, including, but not limited to, a hydraulic actuator, a pneumatic actuator, or an electro-mechanical actuator.

Figure 3:
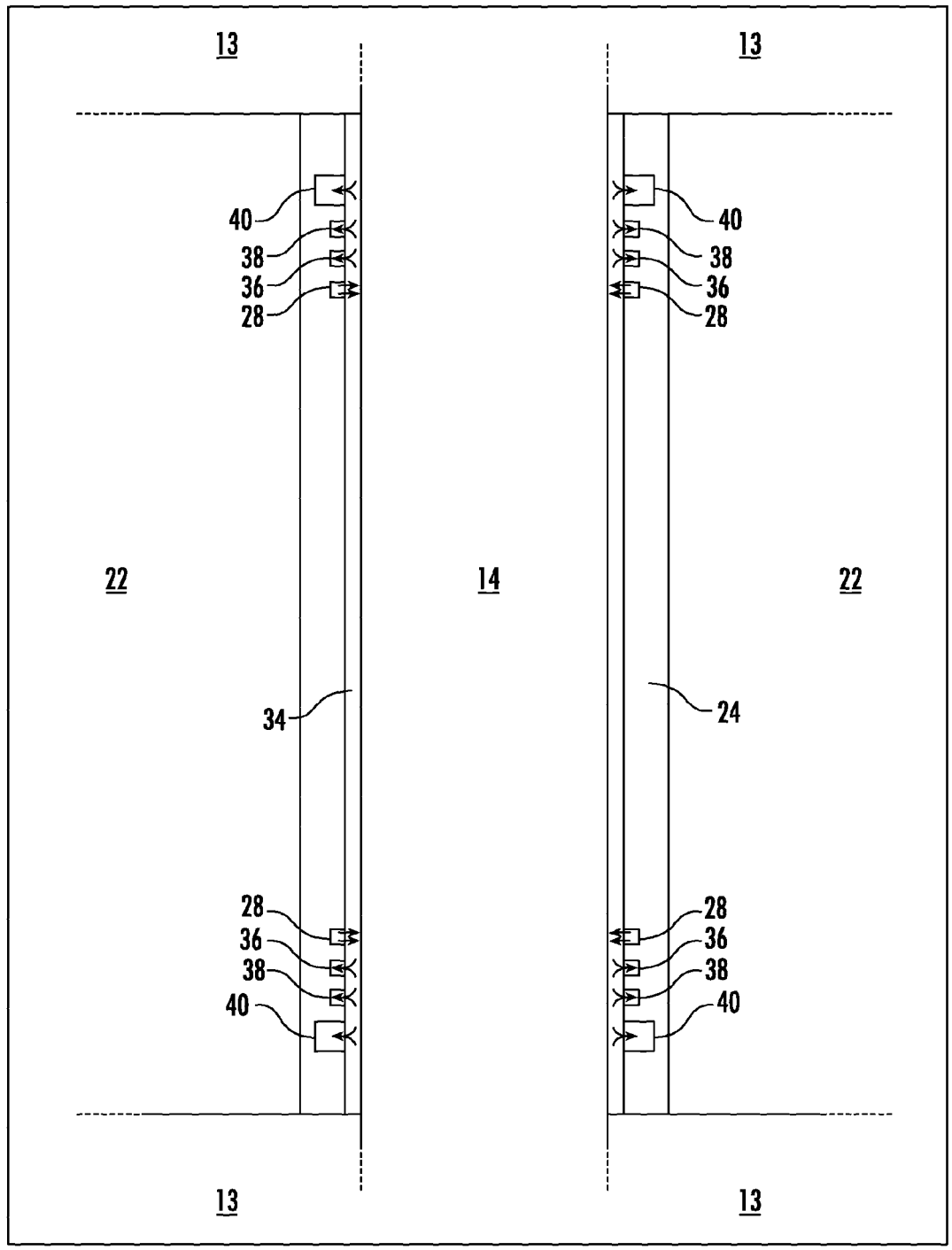
FIG. 3 is a detailed cross-sectional view illustrating an air bearing of the ion implantation apparatus shown in FIG. 1.

Referring to the rear cross-sectional view of the vacuum robot 11 shown in FIG. 2, the shafts 14, 16 may extend through respective cylindrical air bearings 24, 26 within the carriage 22. A detailed cross-sectional view of the air bearing 24 and the shaft 14 is shown in FIG. 3. It will be understood that the air bearing 26 is substantially identical to the air bearing 24, and that the following description of the air bearing 24 with reference to FIG. 3 shall therefore also apply to the air bearing 26.

In operation, the air bearing 24 may expel pressurized gas radially inwardly toward the shaft 14 extending therethrough, such as via radially inwardly-facing gas outlets 28.

The pressurized air may be supplied to the gas outlets 28 by one or more high pressure gas sources 30 via a pressurized gas line 32 (shown in FIG. 2), for example. The air bearing 24 may thereby create and maintain an annular, gas-filled gap 34 between the air bearing 24 and the shaft 14. Thus, under normal operating conditions, the air bearing 24 may prevent or greatly mitigate transverse movement of the carriage 22 relative to the longitudinal axis of the shaft 14 while also mitigating physical contact between the carriage 22 and the shaft 14. The carriage 22 may thereby be scanned vertically within the process chamber 13 without generating particulate contaminants that could otherwise be produced by engagement between the carriage 22 and the shaft 14.

While the gas outlets 28 of the air bearing 24 are shown in FIG. 3 as being disposed on either lateral side of the shaft 14 adjacent the top and bottom of the carriage 22, it is contemplated that the particular arrangement and number of the gas outlets 28 can be varied without departing from the scope of the present disclosure. Furthermore, it will be appreciated that although the carriage 22 in the illustrated embodiment is described as being used in conjunction with the air bearings 24, 26, the use of air bearings is not critical and it is contemplated that other appropriate support and bearing arrangements can be used as desired.

Still referring to FIG. 3, the air bearing 24 may further be provided with differential pumping grooves 36, 38, 40 for preventing pressurized gas in the gas-filled gap 34 from entering and contaminating the vacuum environment of the process chamber 13. The differential pumping grooves 36, 38, 40 may be coupled to one or more vacuum sources 42 via an internal volume 43 of a linkage conduit 44 (shown in FIG. 2) of the apparatus 10 as further described below. For example, each of the differential pumping grooves 36, 38, 40 may be coupled to a separate vacuum source, or all of the differential pumping grooves 36, 38, 40 may be coupled to a common vacuum source. Additionally, some of the differential pumping grooves 36, 38, 40 (e.g. the larger differential pumping grooves 40) may be so-called "high vacuum ports" that collect gas at a much lower pressure than other of the differential pumping grooves. Since the pressure at such high vacuum ports is relatively low, they may be connected to their corresponding vacuum source(s) by a fluid conduit having a relatively large cross sectional flow area that is capable of facilitating the desired mass flow rate of gas. For example, in one non-limiting embodiment of the present disclosure, the high vacuum ports may be coupled to the one or more vacuum sources 42 via the large internal volume 43 of the linkage conduit 44 while the other differential pumping grooves may be coupled to the same or different vacuum sources via smaller lines, tubes, pipes, etc. that are routed through the linkage conduit 44.

The vacuum source 42 may draw gas into the differential pumping grooves 36, 38, 40 in a successive, multi-stage manner. Particularly, gas in the gas-filled gap 34 that migrates vertically toward the vacuum environment of the process chamber 13 above and below the air bearing 24 may first encounter the inward-most differential pumping grooves 36, which may capture a portion of the gas. Any remaining gas that is able to migrate past the differential pumping grooves 36 may then encounter the next inward-most differential pumping grooves 38, which may capture a portion of the remaining gas. Any remaining gas that is able to migrate past the differential pumping grooves 38 may finally encounter the outward-most differential pumping grooves 40, which may capture the remaining gas. The flow of potentially contaminating gas into the vacuum environment of the process chamber 13 is thereby mitigated or entirely prevented.

It will be appreciated that while the illustrated embodiment of the air bearing 24 employs the differential pumping grooves 36, 38, 40 to seal the vacuum environment of the process chamber 13 from the gas-filled gap 34, other sealing devices and arrangements can additionally or alternatively be implemented. For example, it is contemplated that a lip seal arrangement could be used in lieu of, or in addition to, the differential pumping grooves 36, 38, 40. It is further contemplated that the number and positions of the differential pumping grooves 36, 38, 40 may be varied without departing from the present disclosure.

Referring again to FIG. 1, the linkage conduit 44 of the apparatus 10 may include pivotably interconnected first, second, third, and fourth linkage members 46, 48, 50, 52 that define a contiguous internal volume 43 extending from the side wall 21 to the carriage 22 and the platen assembly 23. Particularly, the first linkage member 46 may extend through the side wall 21 of the enclosure 12, while the fourth linkage member 52 may be interposed between, and may be coupled to, the carriage 22 and the platen assembly 23. The first, second, third, and fourth linkage members 46, 48, 50, 52 may be coupled to one another at in a fluid-tight manner at adjoining longitudinal ends by rotary seals 54, 56, 58, which may include, but are not limited to, ferrofluidic seals, lip seals, differentially-pumped seals, or the like. The rotary seals 54, 56, 58 can operate to seal the internal volume 43 of the linkage conduit 44 from the vacuum environment of the process chamber 13.

In one instance, the linkage conduit 44 may be coupled to a vacuum source, such as the previously described vacuum source 42 (shown in FIG. 2). The vacuum source 42 may draw any gas out of the linkage conduit 44 (as indicated by dashed line 45 in FIG. 2) and operate to maintain the entire internal volume 43 of the linkage conduit 44 at or near a desired vacuum pressure. Thus, the linkage conduit 44 may define a vacuum enclosure that is entirely sealed from the vacuum environment of the process chamber 13.

The linkage conduit 44 may, through relative pivoting movement of the first, second, third, and fourth linkage members 46, 48, 50, 52, and facilitated by the rotary seals 54, 56, 58, be vertically extended and retracted within the process chamber 13 to move the platen assembly 23 to a desired position in relation to an ion beam 72. Particularly, by virtue of the coupling between the fourth linkage member 52 and the carriage 22, the linkage conduit 44 may be configured (i.e., pulled) into an extended position (shown in FIGS. 1 and 2) and configured (i.e., pushed) into a retracted position (not shown) when the carriage 22 is driven up and down along the shafts 14, 16 by the linear drive mechanism as described above. The linkage conduit 44 thereby "follows" the carriage 22 (and the platen assembly 23) during movement thereof. The utility of such following and of the vacuum enclosure defined by the linkage conduit 44 will be described in greater detail below.

While the linkage conduit 44 has been shown and described as including four pivotably interconnected linkage members 46, 48, 50, 52, it is contemplated that the linkage conduit 44 may be similarly implemented with a greater or fewer number of linkage members without departing from the present disclosure.

As shown in FIG. 1, the platen assembly 23 of the apparatus 10 may include a platen 25 and a support bracket 60 for coupling the platen 25 to the fourth linkage member 52 of the linkage conduit 44. The platen 25 may use electrostatic clamping, mechanical clamping, or a combination of electrostatic and mechanical clamping to retain a substrate on a forward surface thereof. In one instance, the platen 25 may be configured to provide backside gas and/or cryogenic cooling to a substrate. The platen assembly 23 may also include various mechanisms that may be employed for controllably changing the position and/or orientation of the platen 25 in a desired manner before, during, and after ion implantation or other processes. For example, the platen assembly 23 may include a drive mechanism 62 that is operatively coupled to the platen 25. The drive mechanism 62 may be configured to controllably rotate and tilt the platen 25, as well as linearly shift the platen 25 slightly forward and backward. Such articulation of the platen 25 may be advantageous for facilitating implantation of a substrate in a particular manner or configuration.

In one non-limiting exemplary embodiment a plasma source 70 may be disposed within or adjacent to the process chamber 13. The plasma source 70 may be any plasma source known to those or ordinary skill in the art. During an implantation process, the plasma source 70 may project an ion beam 72 horizontally through an aperture 74 onto a vertically oriented surface of a substrate that is clamped to the platen 25. The ions in the ion beam may penetrate the surface of the substrate and may come to rest within the substrate to form one or more regions of desired conductivity. The platen 25 may be vertically scanned in the manner described above (i.e., by vertically shuttling the carriage 22 along the shafts 14, 16), thereby moving the substrate in a direction orthogonal to the horizontal path of the ion beam 72. Selected portions of the substrate may thereby be exposed to the ion beam 72 in a controlled manner.

Referring again to FIG. 2, numerous components of the carriage 22 and the platen assembly 23 of the apparatus 10 may require various facilities to be routed thereto for facilitating certain functions. For example, as described above, the pressurized gas outlets 28 of the air bearings 24, 26 of the carriage 22 may require coupling to one or more high pressure gas sources 30. Similarly, the differential pumping grooves 36, 38, 40 of the air bearings 24, 26 may require coupling to one or more vacuum sources 42. Furthermore, various components of the platen assembly 23, such as the platen 25 and the drive mechanism 62, may require coupling to various facilities 75 for cooling, heating, powering, and controllably moving the platen 25. These facilities 75 may include, but are not limited to, cooled and/or heated gas sources, a cryogenic fluid source, a controller, an electrical power source, etc.

Some or all of the components of the carriage 22 and/or the platen assembly 23 may be coupled to their respective facilities via the linkage conduit 44. For example, the pressurized gas line 32 that couples the pressurized gas outlets 28 of the air bearings 24, 26 to the one or more high pressure gas sources 30 may be routed through the internal volume 43 of the linkage conduit 44 as shown in FIG. 2. Similarly, components of the platen assembly 23 (e.g., the platen 25 and the drive mechanism 62) may be coupled to the facilities 75 by respective coupling members (indicated by the single line 76 in FIG. 2), which may include, but are not limited to, lines, wires, conductors, tubes, hoses, pipes, etc. that are routed through the internal volume 43 of the linkage conduit 44. Additionally, since the internal volume 43 of the linkage conduit 44 is held at vacuum pressure by the one or more vacuum sources 42 as described above, the internal volume 43 itself may couple one or more of the differential pumping grooves 36, 38, 40 of the air bearings 24, 26 to the one or more vacuum sources 42 without requiring any separate coupling members to be routed through or outside of the linkage conduit 44. The relatively large cross-sectional size of the linkage conduit 44 makes it particularly suitable for evacuating large volumes of gas that are collected at the differential pumping grooves 36, 38, 40, and particularly certain of the differential pumping grooves 36, 38, 40 that may be "high vacuum ports" as described above.

Coupling the components of the carriage 22 and/or the platen assembly 23 to their respective facilities via the linkage conduit 44 confers numerous advantages relative to traditional vacuum robot configurations. For example, since the internal volume 43 of the linkage conduit 44 is a vacuum environment that is sealed from the process chamber 13, particulate contaminants that may be produced by frictional engagement between lines, wires, conductors, tubes, hoses, pipes, etc. that extend through the linkage conduit 44 are prevented from entering and contaminating the process chamber 13. Additionally, the vacuum environment within the linkage conduit 44 provides a natural insulator for any cryogenic lines that may be routed therethrough (e.g., for providing coolant to the platen 25), thereby obviating the need to provide such cryogenic lines with bulky insulating materials and sheathing that take could otherwise take up a great deal of space within the process chamber 13.

Figure 4:
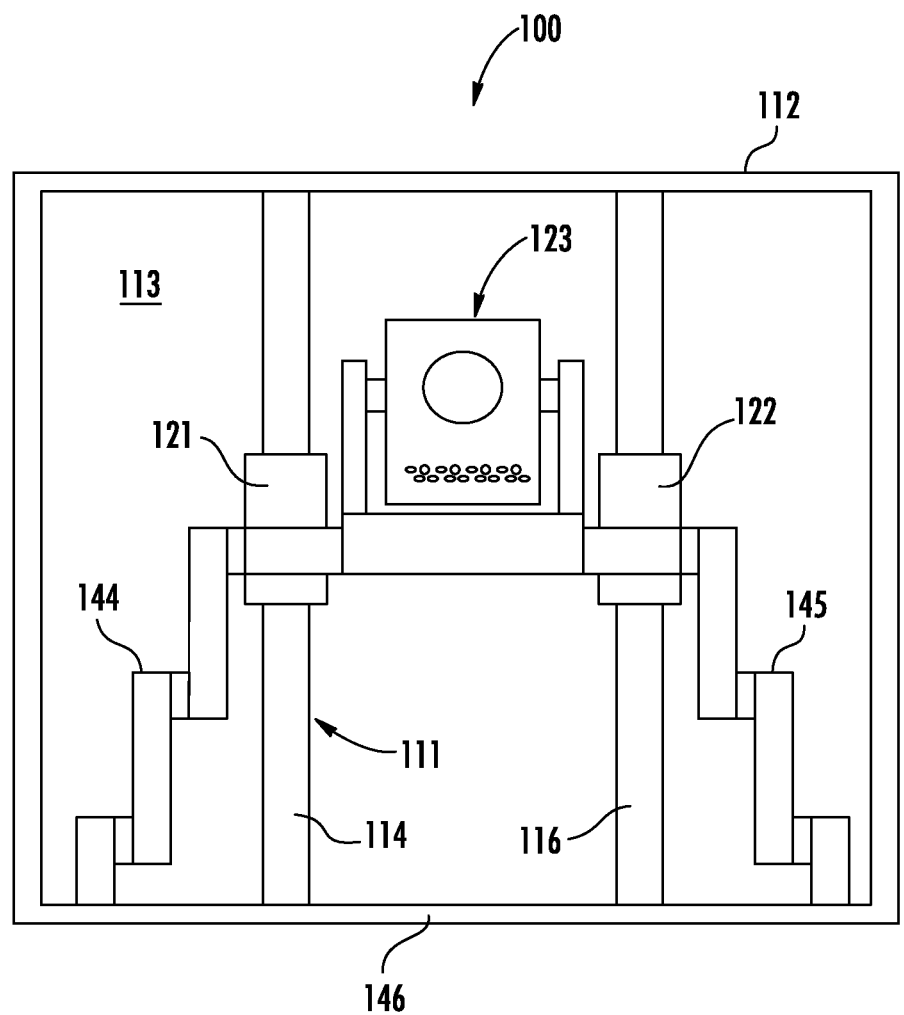
FIG. 4 is a cut-away front view illustrating an exemplary ion implantation apparatus in accordance with an alternative embodiment of the present disclosure.

Referring to FIG. 4, a further ion implantation apparatus 100 (hereinafter "the apparatus 100") in accordance with the present disclosure is shown. Like the apparatus 10 described above, the apparatus 100 may include an enclosure 112 that defines a process chamber 113. One or more pumps (not shown), such as turbomolecular pumps or cryogenic pumps, may be connected to the enclosure 112 for establishing and maintaining a vacuum environment within the process chamber 113. The apparatus 100 may further include a vacuum robot 111 that includes a pair of vertically-movable carriages 121, 122 mounted on respective, vertically oriented, horizontally spaced shafts 114, 116. The carriages 121, 122 may be adapted for selective vertical movement along the shafts 114, 116 for controllably raising and lowering a platen assembly 123 that may be disposed intermediate, and coupled to, the carriages 121, 122. For example, one or more linear drive mechanisms (not shown) may be operatively connected to the carriages 121, 122 and may controllably drive or "scan" the carriages 121, 122 vertically between a fully raised position (shown in FIG. 4) and a fully lowered position (not shown). The linear drive mechanisms may be any type of linear actuators that are suitable for scanning the carriages 121, 122 in a controllable manner, including, but not limited to, hydraulic actuators, pneumatic actuators, or electro-mechanical actuators.

The apparatus 100 may further include linkage conduits 144, 145, each extending between a side wall 146 of the enclosure 112 and a respective one of the carriages 121, 122. The linkage conduits 144, 145 may be substantially similar to the linkage conduit 44 described above, and may similarly provide a sealed internal volume that is held at vacuum pressure for routing various facilities (not shown) to components of the carriages 121, 122 and the platen assembly 123. In an alternative embodiment of the apparatus 100, one of the linkage conduits 144, 145 may be omitted and all of the facilities may be routed to the carriages 121, 122 and the platen assembly 123 via a single linkage conduit.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An ion implantation apparatus comprising:
   an enclosure defining a process chamber;
   a carriage slidably mounted on a shaft within the process chamber and coupled to a drive mechanism adapted to selectively move the carriage along the shaft;
   a platen assembly coupled to the carriage; and
   a linkage conduit extending between a side wall of the enclosure and the carriage, the linkage conduit comprising a plurality of pivotably interconnected linkage members that define a contiguous internal volume, the linkage conduit coupled to a vacuum source that maintains vacuum pressure within the internal volume.

2. The ion implantation apparatus of claim 1, wherein the linkage members are coupled to one another by fluid-tight seals that seal the internal volume of the linkage conduit from the process chamber.

3. The ion implantation apparatus of claim 1, wherein the carriage includes an air bearing surrounding the shaft, the air bearing for mitigating transverse movement of the carriage relative to the shaft and to mitigate physical contact between the carriage and the shaft.

4. The ion implantation apparatus of claim 3, wherein the air bearing includes a plurality of gas outlets for expelling pressurized gas toward the shaft.

5. The ion implantation apparatus of claim 4, wherein the air bearing further includes a plurality of differential pumping grooves disposed adjacent the gas outlets, the differential pumping grooves arranged to remove the pressurized gas expelled by the gas outlets.

6. The ion implantation apparatus of claim 1, wherein the platen assembly includes a platen for supporting a substrate, and a support bracket that couples the platen to the linkage conduit.

7. The ion implantation apparatus of claim 1, wherein a component of the carriage is coupled to a corresponding facility located outside of the enclosure by a coupling member that is routed through the linkage conduit.

8. The ion implantation apparatus of claim 7, wherein the facility includes a pressurized gas source.

9. The ion implantation apparatus of claim 1, wherein a component of the platen assembly is coupled to a corresponding facility located outside of the enclosure by a coupling member that is routed through the linkage conduit.

10. The ion implantation apparatus of claim 9, wherein the facility includes a cryogenic fluid source.

11. A linkage conduit for an ion implantation apparatus, the linkage conduit comprising:
    a plurality of interconnected linkage members;
    wherein the plurality of interconnected linkage members together define a contiguous internal volume that is coupled to a vacuum robot and a platen assembly, the linkage conduit coupled to a vacuum source that maintains vacuum pressure within the internal volume.

12. The linkage conduit of claim 11, wherein each of the plurality of interconnected linkage members are coupled to adjacent ones of the plurality of interconnected linkage members by fluid-tight rotary seals.

13. The linkage conduit of claim 12, wherein the fluid-tight rotary seals are ferrofluidic seals.

14. The linkage conduit of claim 11, wherein a coupling member that couples a component of the vacuum robot to a corresponding facility is routed through the internal volume.

15. The linkage conduit of claim 14, wherein the facility includes a pressurized gas source.

16. The linkage conduit of claim 11, wherein a coupling member that couples a component of the platen assembly to a corresponding facility is routed through the internal volume.

17. The linkage conduit of claim 16, wherein the facility includes a cryogenic fluid source.

18. An ion implantation apparatus comprising:
an enclosure defining a process chamber;
a carriage slidably mounted on a pair of shafts within the process chamber and coupled to a drive mechanism adapted to selectively move the carriage along the shafts, the carriage including air bearings surrounding the shafts that are adapted to mitigate transverse movement of the carriage relative to the shafts and to mitigate physical contact between the carriage and the shafts;
a platen assembly coupled to the carriage; and
a linkage conduit extending between a side wall of the enclosure and the carriage, the linkage conduit comprising a plurality of pivotably interconnected linkage members that are coupled to one another by fluid-tight rotary seals and that define a contiguous internal volume, wherein the linkage conduit is coupled to a vacuum source that maintains vacuum pressure within the internal volume.

* * * * *